United States Patent [19]

Forlani

[11] 3,795,043

[45] Mar. 5, 1974

[54] METHOD FOR OBTAINING BEAM LEAD CONNECTIONS FOR INTEGRATED CIRCUITS

[75] Inventor: Franco Forlani, Monza, Italy

[73] Assignee: Honeywell Information Systems Italia, Caluso, Italy

[22] Filed: Nov. 2, 1971

[21] Appl. No.: 196,442

[30] Foreign Application Priority Data

Nov. 5, 1970 Italy .................................. 31333/70

[52] U.S. Cl. ........................ 29/574, 29/580, 29/578, 29/591

[51] Int. Cl. ............................................ B01j 17/00

[58] Field of Search ... 29/574, 578, 576 S, 589, 577

[56] References Cited

UNITED STATES PATENTS

| | | | |
|---|---|---|---|
| 3,271,625 | 9/1966 | Caracciolo | 317/101 |
| 3,374,537 | 3/1968 | Doelp | 29/627 |
| 3,390,308 | 6/1968 | Marley | 317/100 |
| 3,641,661 | 2/1972 | Canning | 29/574 |

*Primary Examiner*—Roy Lake
*Assistant Examiner*—W. C. Tupman
*Attorney, Agent, or Firm*—William F. White; Ronald T. Reiling

[57] ABSTRACT

A process for obtaining beam leads for connecting integrated circuit chips to an external circuit substrate, wherein aluminum beam leads are formed and directly and simultaneously bonded to aluminum pads on the chips while continuously being supported.

7 Claims, 8 Drawing Figures

Franco FORLANI
INVENTOR.

By [signature]
ATTORNEY.

Franco FORLANI
INVENTOR.
By [signature]
ATTORNEY.

Franco FORLANI
INVENTOR.
By [signature]
ATTORNEY.

METHOD FOR OBTAINING BEAM LEAD CONNECTIONS FOR INTEGRATED CIRCUITS

BACKGROUND OF THE INVENTION

The instant invention relates to production technology for semiconductor integrated circuits and, more particularly, to the technology of interconnecting such circuits.

The type of connecting lead preferable for integrated circuits is known as the beam lead and is well known in the art.

In beam lead technology the semiconductor chip, on which an integrated circuit is fabricated by deposition and diffusion, is connected by relatively thick leads, partially projecting beyond the chip edge, to an external circuit, which may comprise a ceramic support bearing conductors for connecting to the pins of an integrated circuit package. Because they are relatively thick, for example 10 or 20 microns, these leads have sufficient strength for rigidly positioning the chip with respect to the ceramic support. Thus, beam leads provide connection means stronger and more reliable than the extremely thin wires used in other integrated circuit connection techniques. However, in fabricating beam leads by methods known heretofore, a number of difficulties and disadvantages are encountered.

For example, electrolytic accretion methods usually have been employed to obtain the required thickness, because it has been too difficult and costly to obtain such thickness by means of deposition or sputtering processes.

This method limits the choice of the material of the beam leads to the metals which may be electrolytically deposited, such as gold, thereby excluding aluminum. Nevertheless, aluminum is usually used for internal circuit connections on the chip.

Aluminum exhibits excellent adhesion to silicon and silicon dioxide while not modifying their physical characteristics, not forming intermetallic compounds, and making optimum electrical contact with silicon. On the other hand, gold does not insure adequate mechanical adhesion to silicon dioxide. Therefore, aluminum is preferred as a conducting metal for internal circuit connections on the chip and gold has been used for connecting aluminum pads arranged along the chip edges to external circuits. However, gold and aluminum in the presence of silicon form an intermetallic compound known as "purple plague", which impairs the physical, electrical and mechanical continuity of the junction. Appropriate measures must be taken to obviate such disadvantages.

The techniques and expediences resorted to for ensuring the adhesion of the gold conductors to the silicon dioxide layer that usually overlies a semiconductor chip and for enabling the bonding together of gold and aluminum considerably limit the scope and advantage of applying this technology, and increase its cost.

An example of such expediencies is to fabricate beam leads having a layered structure of different materials, which is described in the U.S. Pat. No. 3,555,365 issued Jan. 12, 1971, for INTEGRATED CIRCUIT MATRIX HAVING PARALLEL CIRCUIT STRIPS and assigned to the assignee of this application.

The techniques employed in these prior art processes also require that during deposition the chip have dimensions to entirely encompass the beam lead conductors. Only after their fabrication is the peripheral portion of the chip chemically etched away to allow the beam leads to effectively project beyond the chip. This requires further operating steps and leads to a waste of costly materials, thereby substantially impairing the economy of the process.

Accordingly, it is the object of the present invention to provide a process for obtaining aluminum beam lead conductors which may be directly and simultaneously bonded to aluminum pads provided on a chip. It is also an object of the invention to insure the permanent positioning on the chip and and the shape of such beam leads during the steps required for their fabrication and bonding to the pads, and if required, the electrical testing operations.

SUMMARY OF THE INVENTION

The process of the invention is based on first creating the beam leads by photoetching them out of aluminum foil of proper thickness, while supporting the beam leads with an underlying substrate comprising a film of photosensitive plastic material of suitable mechanical strength. Next, an opening is cut in the film to provide precise positioning of a semiconductor chip therein, so that the terminal pads of the chip coincide with the free ends of the beam leads. The beam leads may be simultaneously bonded to the corresponding pads of a chip positioned in the opening, for instance by ultrasonic bonding. The beam lead conductors may continue to be mutually insulated and held in place by the plastic underlying film during subsequent operations for electrically testing the chip, if desired. The film is removed only when the external ends of the beam lead connectors are bonded to external conductors, such as those borne by a surrounding ceramic support.

BRIEF DESCRIPTION OF THE DRAWING

The invention will be described with reference to the accompanying drawings, wherein.

DESCRIPTION OF THE PREFERRED EMBODIMENT

Figure 1:
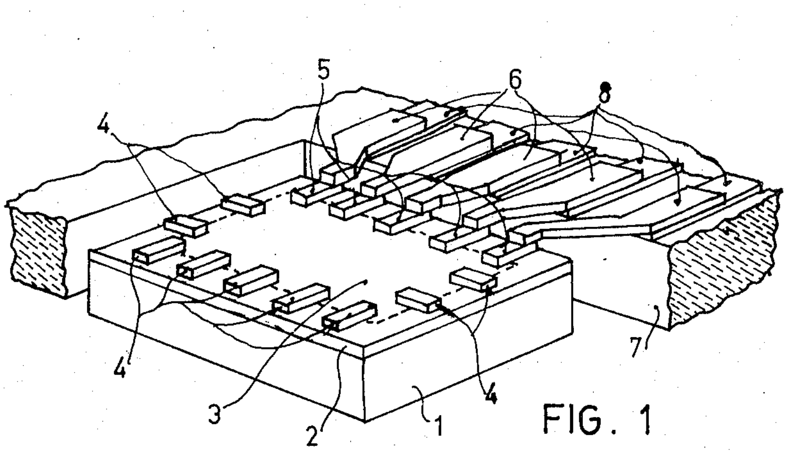
FIG. 1 is a perspective view of an integrated circuit connected to a surrounding ceramic support, shown in part, by means of beam lead connectors.

FIG. 1 shows a silicon chip 1 partially overlaid by an insulating layer 2 of silicon dioxide. By known methods an integrated circuit, not shown, contained in the area 3 bounded by the dashed line is fabricated on chip 1. The input and output conductors of the integrated circuit terminate at aluminum pads 4 and 5, arranged along the edges of chip 1. In FIG. 1, five beam leads 6 are shown bonded to corresponding pads 5 along an upper horizontal edge of chip 1. It is understood that other beam leads, not shown for clarity, are also bonded to pads 4. Reference numeral 7 indicates part of a plate, usually made of a ceramic material, which surrounds chip 1. Leads 8 are deposited on plate 7. The external larger ends of beam leads 6 are bonded to leads 8, thereby providing connection of beam leads 6 to the pins of the package containing the integrated circuit, for example, or to other beam leads coupled to other chips mounted on plate 7.

The process of the invention is directed to obtaining a silicon chip with beam leads simultaneously bonded to respective pads thereof, and in some cases already electrically tested so as to be ready for connection to an external plate, such process is based on the use of a photosensitive plastic film of relatively high mechanical resistance capable of supporting the beam leads.

A plastic film of this type is marketed by the E. I. duPont de Nemours Company under the trade name of Riston. As shown in the left portion of FIG. 2, Riston film comprises a thin film, or layer, 10 of solid plastic photosensitive material. Riston film 10 is shown sandwiched between two transparent films, a polyethylene film 12 and a polyester film 13 (for example, the product known by the trade name Mylar). Riston film 10 has good mechanical strength, exhibits sufficient elasticity to adhere to plane or slightly curved surfaces, and may be "photopolymerized" by exposure to light, thereby changing its characteristics.

By selective exposure, using masking means, the photosensitive materials are selectively modified by polymerization. The unexposed portions of the photosensitive materials, which were not polymerized, may be etched away by suitable etchants, whereas the exposed portions, which were polymerized, remain and retain the above-mentioned mechanical characteristics. As with other photosensitive substances, termed "photoresists," used in photoetching processes, the remaining photosensitive material may be subsequently removed by the use of proper solvents called "strippers." It is to be emphasized that plastic photosensitive materials such as Riston differ from the common photoresists by being solid in form, thereby providing a good mechanical support for thin and weak mechanical members adhering thereto, such as beam leads.

In accordance with the invention beam leads are fabricated and applied to semiconductor chips by the following described process.

Figure 2:
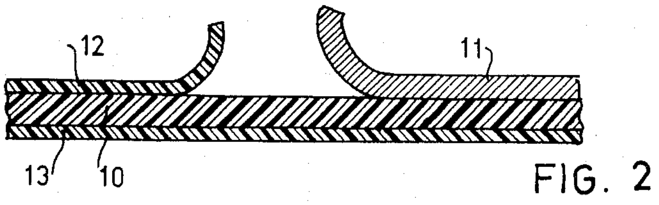
FIG. 2 is a schematic cross-sectional view showing respectively in its left and right portions the structure of a photosensitive plastic film known by the trade name of Riston and the layered structure of a metallic foil to which the Riston film is applied in a first step of the process of the invention.

Polyethylene film 12 is removed from Riston film 10 and then the photosensitive Riston film 10, covered by mylar film 13, is applied to adhere to the lower surface of a sheet, foil, or ribbon 11 of aluminum, which has a thickness of 20 microns, for example. At this time the structure shown in the right portion of FIG. 2 is obtained.

Figure 3:
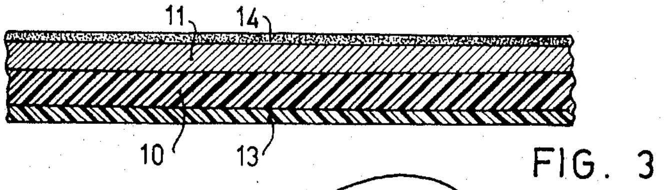
FIG. 3 is a cross-sectional view showing the layered structure from which the beam lead conductors are obtained in a second step of the process.

A photosensitive paint 14, such as a photoresist, is applied by known means to the upper surface of aluminum sheet 11, thereby obtaining the structure shown in FIG. 3. Photoresist 14 may be, for example, of the positive type.

Figure 4:
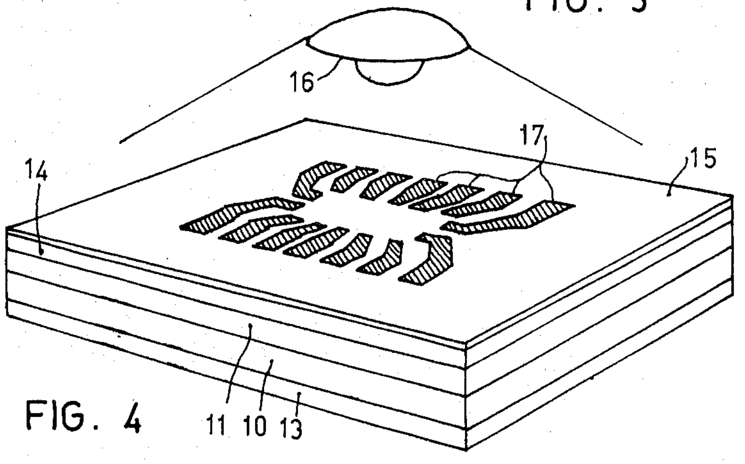
FIG. 4 is a perspective view of a third step of the process, wherein the structure of FIG. 3 is masked and exposed.

A photographic mask 15, in which the pattern of the beam leads is defined by opaque regions, is then applied to the prepared structure of FIG. 3 and photoresist 14 is exposed through mask 15 to a suitable radiation source 16 (FIG. 4). After such exposure, the photoresist is developed and etched, whereupon a protective layer having the same pattern as the desired beam leads remains on aluminum sheet 11, the other photoresist being removed.

Figure 5:
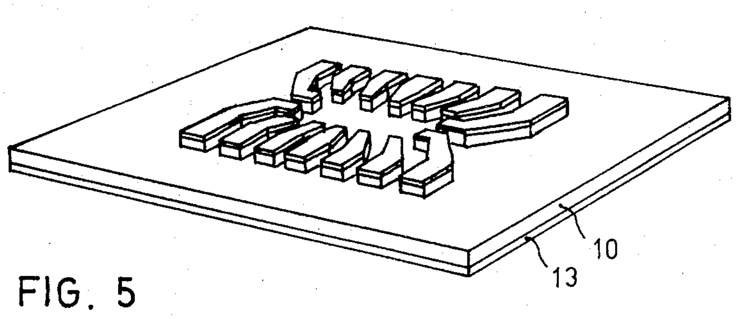
FIG. 5 is a perspective view of the product obtained in a fourth step of the process.

In a succeeding step, aluminum sheet 11 is chemically etched, thereby removing the aluminum material from the regions not protected by the photoresist. Thus, beam leads are "carved" out of the aluminum sheet to their precise shapes and in their respective required positions. These beam leads adhere by their lower surfaces to the Riston layer 10. Layer 10 has not been affected by the above-mentioned operations, because during the preceding exposure layer 10 was protected from the illuminating radiation by aluminum sheet 11, and during the preceding development and etching of the photoresist on the upper face, layer 10 is protected both by aluminum sheet 11 on one face and by mylar film 13 on the other face. It is to be stressed that the substances used for developing the upper face photoresist and the etchant used for removing the aluminum in the non-protected areas are selected so as to have no effect on the Riston layer. The structure obtained after this latter step in the process is shown in FIG. 5.

At this point a bath of a "stripper" solvent is used for removing the photoresist layer remaining on the upper surface of the beam leads. This bath must be selective and not affect the Riston film. For example, acetone is a stripper commonly used for dissolving the available photoresists and does not affect Riston.

Figure 6:
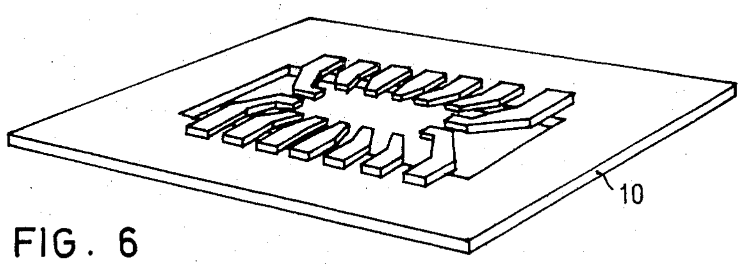
FIG. 6 is a perspective view of the product obtained in a fifth step of the process.

Next, if convenient, although not necessary, the protecting mylar film 13 is removed from the lower surface of Riston layer 10. Then the Riston layer is exposed to a radiation source through an appropriate mask, followed by a development and etching process to obtain an opening of size and shape suitable for receiving a chip over which the beam leads project. The structure obtained after this step of the process is shown in FIg. 6. The beam leads are mutually electrically insulated and held in proper spaced-apart positions by a frame of Riston material, which ensures suitable mechanical rigidity for the entire structure.

A chip bearing an integrated circuit then may be arranged and centered in the opening under the beam leads, or, alternatively if conditions warrant, over the beam leads, so that the inner ends of the beam leads are superposed precisely opposite to corresponding pads on the chip. All the beam leads may then be bonded simultaneously to the corresponding pads by ultrasonic means.

Since both of the members to be bonded together in each instance are of aluminum, an entirely satisfactory bond is obtained, both from the point of view of electrical conductivity and from the point of view of mechanical strength, as is known in the art.

After such bonding, the chip with beam leads attached thereto is separated from the Riston frame, either by using chemical solvents, or, preferably, by mechanical punching. The punching operation employs punch which cuts the beam leads to the required length and bends them in the vertical plane according to requirements either for supporting the chip in a suitable package or for bonding the chip to a ceramic plate provided with electrical circuits.

Figure 8:
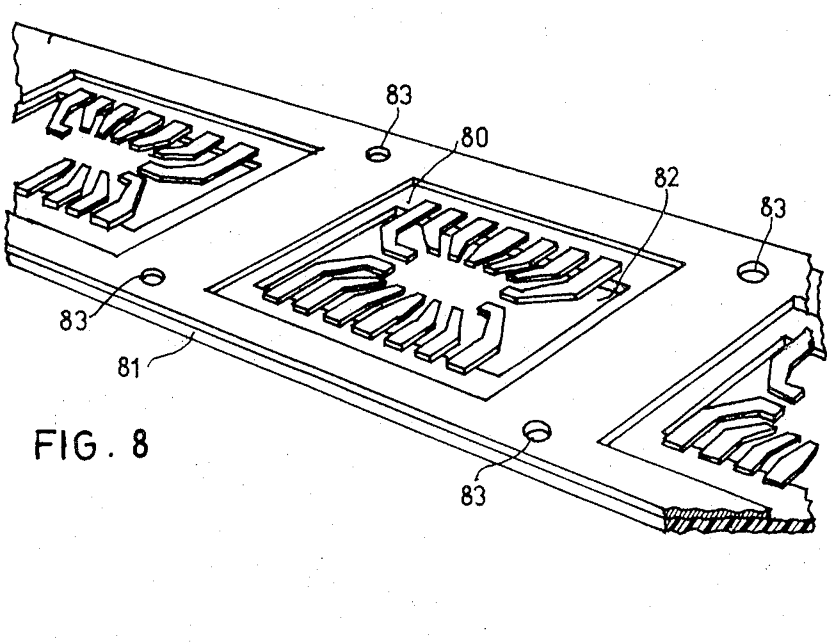
FIG. 8 is a perspective view showing a portion of a product of the continuous production process of FIG. 7.

Accordingly, the process described herein is simple and economical for obtaining integrated circuit chips provided with aluminum beam leads. Other advantages are also demonstrated; for example, because the beam leads are electrically insulated while being rigidly held in position by the Riston frame, electrical measurements and static and dynamic tests can be made on the chip to test the circuit operating characteristics and the quality of the chip and of the bonded points, without the possibility of damaging the relatively sturdy mechanical assembly formed by the chip and the beam leads. To improve the rigidity and strength of the structure, an outer frame of aluminum may be provided, as shown in FIG. 8.

Following the testing operation, the various chips may be selected and sent directly to a packaging facility or may be stored for future use.

The process of the invention also lends itself to a continuous operation, with all the inherent advantages of economy, repeatability and reliability. Thus, FIG. 7 represents schematically a method for carrying out the process of the invention as a continuous process and demonstrates that the order in which the different steps are performed may differ from the described order of the steps, without departing from the spirit and scope of the invention.

Figure 7:
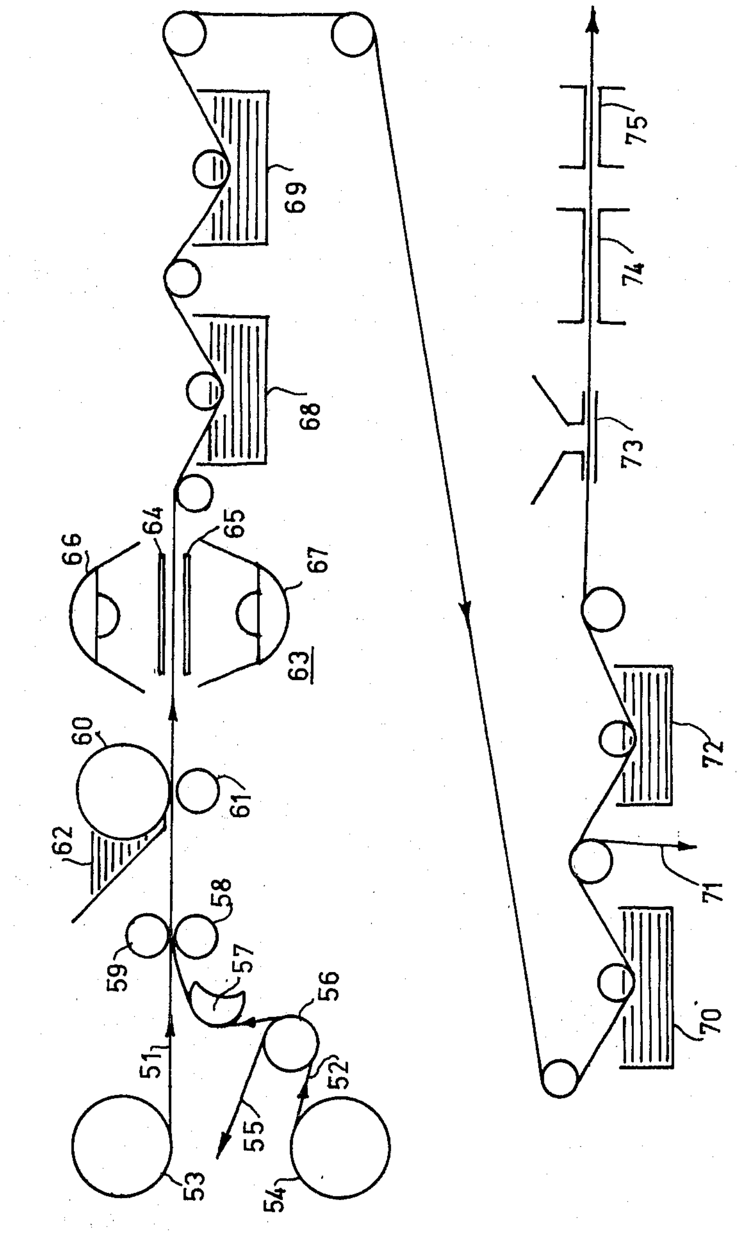
FIG. 7 is a schematic diagram illustrating how a continuous production process may be implemented in accordance with the instant invention.

In FIG. 7, an aluminum ribbon 51 and a Riston ribbon 52 are unwound from respective supply rolls 53 and 54. The polyethylene film 55 is removed from the Riston layer by a roller 56, whereupon the Riston layer is heated by a heating member 57 and applied with pressure, as exerted by rollers 58 and 59, against the lower face of aluminum ribbon 51 to adhere thereto. The upper face of aluminum ribbon 51 is then uniformly coated with photoresist 62 upon passage of the laminated product through rollers 60 and 61.

The aluminum and Riston ribbon sandwich thus prepared is driven incrementally through an exposure station 63; i.e., with rapid advancement steps alternating with halts. Exposure station 63 comprises an upper mask 64 and a lower mask 65 precisely arranged in opposed positions and radiation sources 66 and 67, which are intermittently activated. After exposure, the ribbon sandwich passes through a photoresist development tank 68, an aluminum etching tank 69 and a stripper tank 70. Then, the mylar film 71 is removed, and the ribbon sandwich, with the aluminum ribbon 51 already etched and the Riston film exposed, enters a Riston development tank 72. After this step the ribbon sandwich may exhibit the structure shown in FIg. 8, wherein the continuous aluminum ribbon has major openings 80 in the interior of which beam leads, supported by the Riston film, are located. The Riston film has noticeably smaller openings 82 than the openings 80 of the aluminum ribbon, and an appropriate portion of the beam leads is cantilevered over openings 82. If required, reference holes 83 may be provided through both the aluminum and the Riston ribbons. The ribbon sandwich then enters a positioning and bonding station 73, wherein integrated circuit chips are bonded in the appropriate positions to the beam leads (FIG. 7).

After emerging from bonding station 73, the ribbon sandwich may enter a test station 74, wherein the chips and the beam leads are submitted to testing. As a result of these tests, the chips may be either accepted or rejected. The rejected chips may be discarded by punching out at a selecting station 75.

The continuous ribbon sandwich, carrying the accepted chips, may then proceed to a packaging station, to a storage facility or to an assembly line, according to the requirements.

I claim:

1. A continuous process for obtaining beam leads for a plurality of integrated circuits, comprising the following steps:

applying a photosensitive plastic film on one surface of a metallic ribbon to thereby form a photosensitive plastic film substrate for the metallic ribbon;
applying a layer of photoresist on the other surface of said metallic ribbon to provide an elongated sandwich ribbon;
moving the sandwich ribbon to an exposure station;
exposing said photoresist at said exposure station to radiation through a first mask;
exposing said photosensitive plastic film substrate at said exposure station to radiation through a second mask;
moving the exposed sandwich ribbon to a first tank for developing said photoresist layer and developing said layer in said first tank to obtain protected regions which represent the pattern of said beam leads;
etching said sandwich ribbon to remove the unprotected regions of said metallic ribbon so as to provide said pattern of beam leads;
moving said sandwich ribbon to a second tank for developing said photosensitive plastic film substrate and developing said film substrate in said second tank to obtain openings in said film substrate which extend through said plastic film substrate to said pattern to beam leads;
moving said sandwich ribbon to a bonding station and bonding said beam leads to integrated circuit semiconductor chips positioned within said openings at said bonding station;
moving said sandwich ribbon to a test station for testing the integrated circuits on said chips; and
moving said sandwich ribbon to a selecting station and selecting the integrated circuits from said sandwich ribbon.

2. A process for providing integrated circuit chips with individual beam leads comprising the following steps:

applying a photosensitive plastic film on one surface of a metallic sheet to thereby form a photosensitive plastic film substrate;
applying a layer of photoresist on the other surface of said metallic sheet;
exposing said photoresist layer to radiation through a suitable masking means;
developing the exposed photoresist layer to obtain protected regions of said metallic sheet which represent the pattern of said beam leads;
chemically etching said metallic sheet to remove the unprotected regions thereof so as to provide said beam leads;

exposing said photosensitive plastic film substrate to radiation through a suitable mask;

developing and etching the exposed plastic film substrate to thereby obtain a plastic frame substrate with an opening therein which extends through said plastic film substrate to said pattern of beam leads;

positioning a semiconductor chip provided with integrated circuits in said opening of the plastic frame substrate so as to correspond with said beam leads; and bonding said beam leads to appropriate locations on the integrated circuit provided on said semiconductor chip.

3. The process of claim 2, comprising the following additional step: electrically testing the integrity of the bonds and the operating quality of said integrated circuit.

4. A process for providing integrated circuit chips with individual beam leads employing a laminated structure comprising a substrate layer of photosensitive plastic and a metallic sheet, comprising the steps of:

applying a layer of photoresist material to the external surface of said metallic sheet;

exposing said photoresist layer to a radiation image of said beam leads;

developing the exposed photoresist layer to obtain protective regions with the pattern of said beam leads;

etching away those portions of said metallic sheet which are not protected by said protective regions so as to obtain said beam leads;

exposing said photosensitive plastic substrate layer to a radiation image of an area into which said beam leads extend;

developing and etching the exposed plastic substrate layer to provide an opening which extends through said plastic layer substrate in said area into which the ends of said beam leads project;

positioning an integrated circuit chip within said opening which extends through said plastic layer substrate with connection so as to register connection pads on said chip with ends of said beam leads which extend into said opening; and bonding said pads to the corresponding beam leads.

5. The process of claim 2 further comprising the step of:

separating said beam leads from said plastic frame substrates so as to thereby obtain a semiconductor chip with accurately positioned and bonded beam leads.

6. The process of claim 4 further comprising the step of:

separating said beam leads which have been bonded to the conection pads on said chip from said plastic substrate layer so as to thereby obtain a semiconductor chip having beam leads which are accurately bonded to the connection pads of said chip.

7. The process of claim 4, wherein said metallic sheet and said connection pads are of aluminum.

* * * * *